US007808816B2

(12) United States Patent
Tanaka et al.

(10) Patent No.: US 7,808,816 B2
(45) Date of Patent: Oct. 5, 2010

(54) SEMICONDUCTOR MEMORY DEVICE AND METHOD FOR FABRICATING SEMICONDUCTOR MEMORY DEVICE

(75) Inventors: Hiroyasu Tanaka, Tokyo (JP); Ryota Katsumata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 11/905,079

(22) Filed: Sep. 27, 2007

(65) Prior Publication Data
US 2008/0089104 A1      Apr. 17, 2008

(30) Foreign Application Priority Data
Sep. 28, 2006   (JP)   .............. 2006-265561

(51) Int. Cl.
G11C 11/00   (2006.01)

(52) U.S. Cl. .............. 365/163; 365/148; 257/2; 977/754

(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| 5,166,758 | A | * | 11/1992 | Ovshinsky et al. | .............. 257/3 |
|---|---|---|---|---|---|
| 5,296,716 | A | * | 3/1994 | Ovshinsky et al. | .............. 257/3 |
| 5,837,564 | A | * | 11/1998 | Sandhu et al. | ................ 438/95 |
| RE37,259 | E | * | 7/2001 | Ovshinsky | ................... 365/163 |
| 6,507,061 | B1 | | 1/2003 | Hudgens et al. | |
| 6,795,338 | B2 | * | 9/2004 | Parkinson et al. | ........... 365/163 |
| 6,969,866 | B1 | * | 11/2005 | Lowrey et al. | ................. 257/3 |
| 7,407,829 | B2 | * | 8/2008 | Lowrey et al. | ................ 438/95 |
| 7,414,883 | B2 | * | 8/2008 | Gordon et al. | ............. 365/163 |
| 2006/0110846 | A1 | * | 5/2006 | Lowrey et al. | ................ 438/95 |
| 2007/0247899 | A1 | * | 10/2007 | Gordon et al. | ............. 365/163 |
| 2008/0089104 | A1 | * | 4/2008 | Tanaka et al. | ................. 365/53 |
| 2008/0101111 | A1 | * | 5/2008 | Chang | ........................ 365/163 |
| 2008/0273379 | A1 | * | 11/2008 | Gordon et al. | ............. 365/163 |

FOREIGN PATENT DOCUMENTS

JP      2004-158854      6/2004

* cited by examiner

*Primary Examiner*—Richard Elms
*Assistant Examiner*—Harry W Byrne
(74) *Attorney, Agent, or Firm*—Finnegan, Henderson, Farabow, Garrett & Dunner, L.L.P.

(57) ABSTRACT

According to an aspect of the present invention, there is provided a semiconductor memory device, including, a semiconductor substrate, a phase-change element formed on the semiconductor substrate, the phase-change element including a phase-change film and electrode films, a joule heat portion contacting with the electrode film, the phase-change film being formed around the joule heat portion, and a radiation-shield film suppressing dissipation of thermal radiation emitted from the joule heat portion.

16 Claims, 14 Drawing Sheets

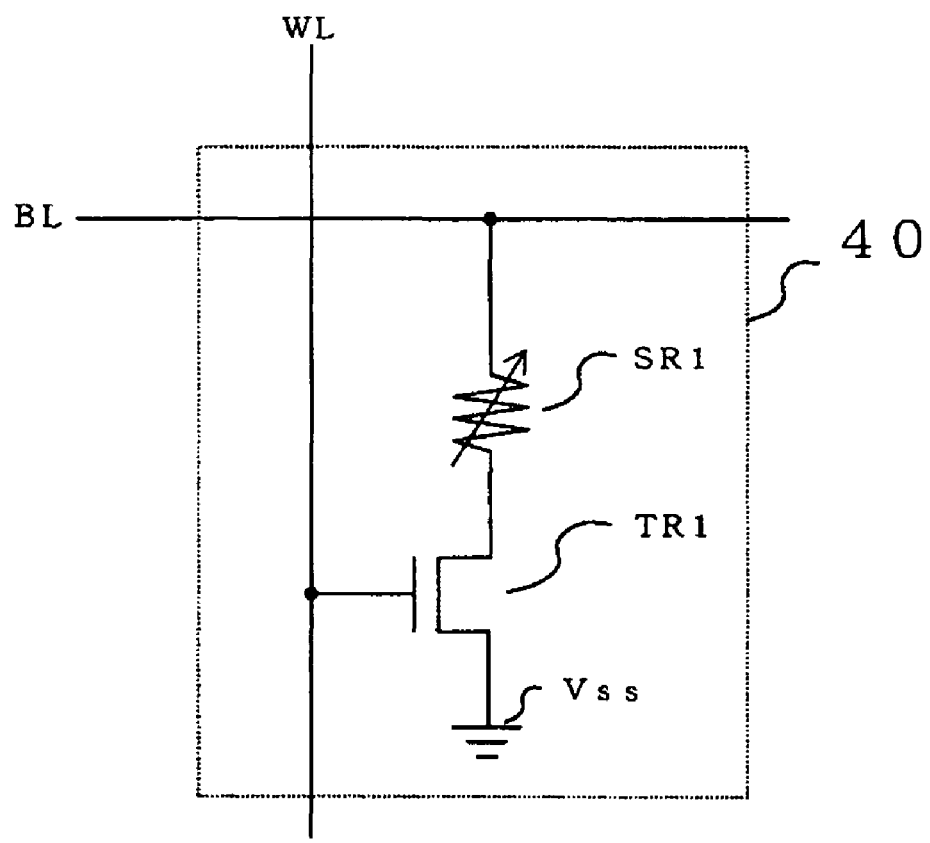
F I G. 1

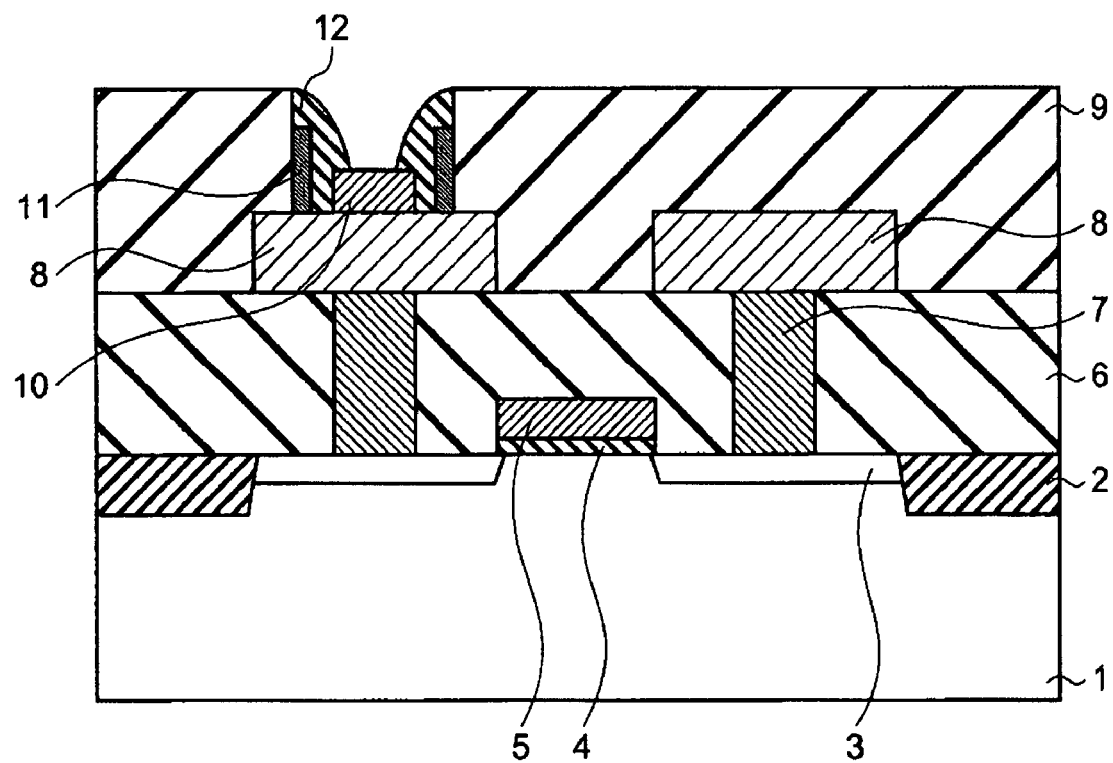
F I G. 7

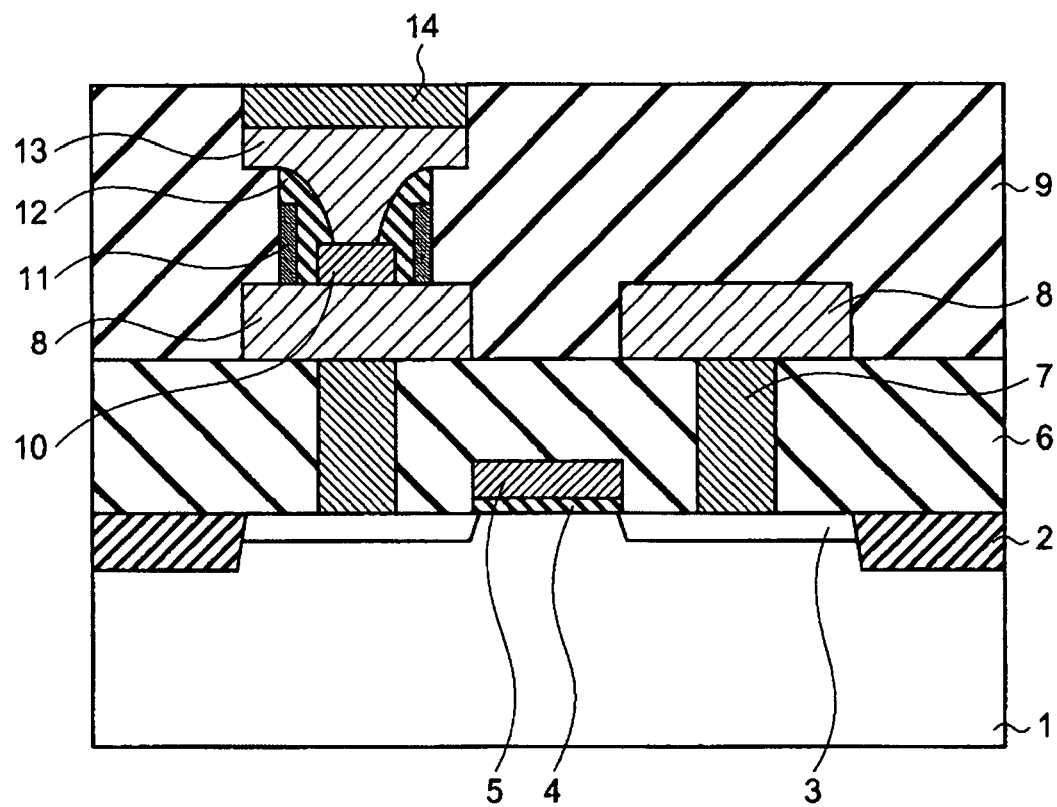
F I G. 9

Exothermic Portion

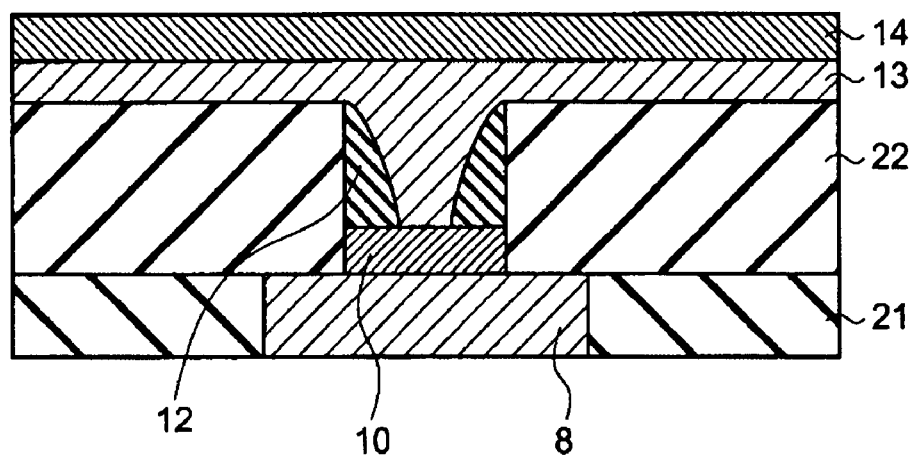
F I G. 1 1
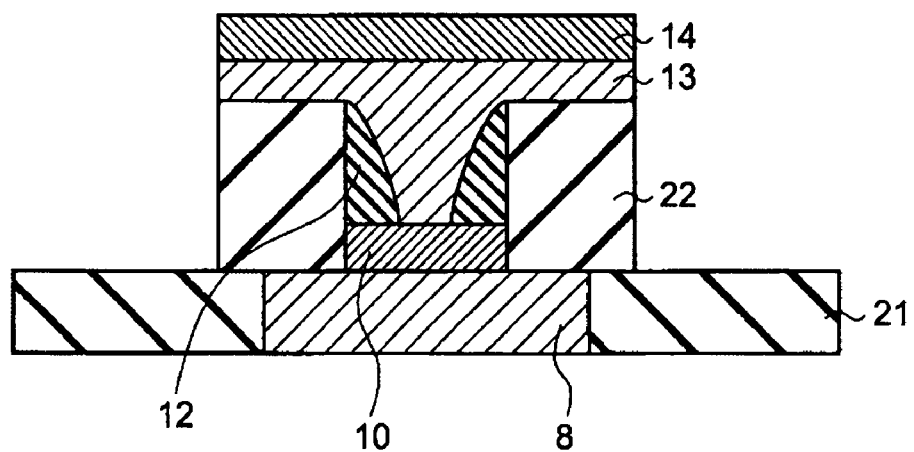
F I G. 1 2

SEMICONDUCTOR MEMORY DEVICE AND METHOD FOR FABRICATING SEMICONDUCTOR MEMORY DEVICE

CROSS REFERENCE TO RELATED APPLICATION

This application is based upon and claims the benefit of priority from the prior Japanese Patent Application No. JP2006-265561, filed Sep. 28, 2006, the entire contents of which are incorporated herein by reference.

FIELD OF THE INVENTION

The present invention relates to a semiconductor memory device and fabricating for the semiconductor memory device.

DESCRIPTION OF THE BACKGROUND

A non-volatile semiconductor memory device in next generation has been developed. The non-volatile semiconductor memory device in next generation has characteristics such as a capability of high speed rewriting and a rewriting number being over five figures as comparing with a conventional EEPROM or flash memory. The non-volatile semiconductor memory device in next generation has also an aim to realize capacity, speed and cost comparable in quality to a DRAM. An FeRAM (Ferroelectric Random Access Memory), a MRAM (Magnetic Random Access Memory), a PRAM (Phase Change Random Access Memory), a RRAM (Resistive Random Access Memory) or the like has been developed as the next-generation non-volatile semiconductor memory device.

The PRAM records information by using different crystalline states of a phase-change element. Actually, when a phase-change element is changed from a poly-crystalline state with lower resistance of "1" state to an amorphous state with higher resistance of "0", so called reset operation, comparatively large current (reset current) is flowed to the phase-change element SR1 so as to rise up a temperature of the phase-change element over melting point (Tm), subsequently, the phase-change element is rapidly cooled. On the other hand, when the phase-change element is changed from the amorphous state with higher resistance of "0" to the poly-crystalline state with lower resistance of "1", so called set operation, comparatively small current (set current) is flowed to the phase-change element so as to retain the phase-change element at a crystallizing temperature (Tc) below Tm as shown in Japanese Patent Publication (Kokai) No. 2004-158854.

The reset current flowing in the phase-change element of the memory cell is comparatively larger, for example 0.5-1 mA. Therefore, generated joule heat or the like in the phase-change element cause difficulty on highly integrating the phase-change memory. Further, necessity of precisely writing in information and reading out information in a low voltage region generates difficulty in the PRAM as disclosed in Japanese Patent Publication (Kokai) No. 2004-158854 (P14 and FIGS. 1 and 2).

According to an aspect of the invention, there is provided, a semiconductor memory device, including, a semiconductor substrate, a phase-change element formed on the semiconductor substrate, the phase-change element including a phase-change film and electrode films, a joule heat portion contacting with the electrode film, the phase-change film being formed around the joule heat portion, and a radiation-shield film suppressing dissipation of thermal radiation emitted from the joule heat portion.

SUMMARY OF THE INVENTION

Further, another aspect of the invention, there is provided, A method for fabricating a semiconductor memory device, including, forming an interconnection layer on a semiconductor substrate, a memory transistor being formed in the semiconductor substrate, a drain or a source of the memory transistor connecting with the interconnection layer, forming an interlayer dielectric film on the interconnection layer, etching the interlayer dielectric film on the interconnection layer so as to form an opening exposing the interconnection layer, forming a radiation-shield film on a side-wall of the opening, forming an insulator on the side-wall of the opening so as to cover the radiation-shield film, forming a lower electrode film on the opening formed the radiation-shield film and the insulator on the side-wall, forming a phase-change film on the lower electrode film, and forming an upper electrode film on the phase-change film.

Further, another aspect of the invention, there is provided a method for fabricating a semiconductor memory device, including, forming a interconnection layer on a semiconductor substrate, a memory transistor being formed in the semiconductor substrate, a drain or a source of the memory transistor connecting with the interconnection layer, forming a first interlayer dielectric film on the interconnection layer, etching the first interlayer dielectric film on the interconnection layer so as to an opening exposing the interconnection layer, forming a lower electrode film of the phase-change element in the opening, forming an insulator onside-wall of the opening with the lower electrode film, forming a phase-change film on the lower electrode film without the insulator, forming an upper electrode film on the phase-change film, forming a second interlayer dielectric film on the first interlayer dielectric film, the phase-change film and the upper electrode film, and forming a radiation-shield film on the second interlayer dielectric film.

BRIEF DESCRIPTION OF THE DRAWINGS

FIG. 1 is a circuit diagram showing a PRAM memory cell in a first embodiment of the present invention;

FIG. 7 is a cross-sectional view showing the processing steps of the phase-change memory in the first embodiment of the present invention;

FIG. 9 is a cross-sectional view showing the processing steps of the phase-change memory in the first embodiment of the present invention;

FIG. 11 is a cross-sectional view showing processing steps of the phase-change memory in the second embodiment of the present invention;

FIG. 12 is a cross-sectional view showing processing steps of the phase-change memory in the second embodiment of the present invention;

DETAILED DESCRIPTION OF THE INVENTION

Figure 2:
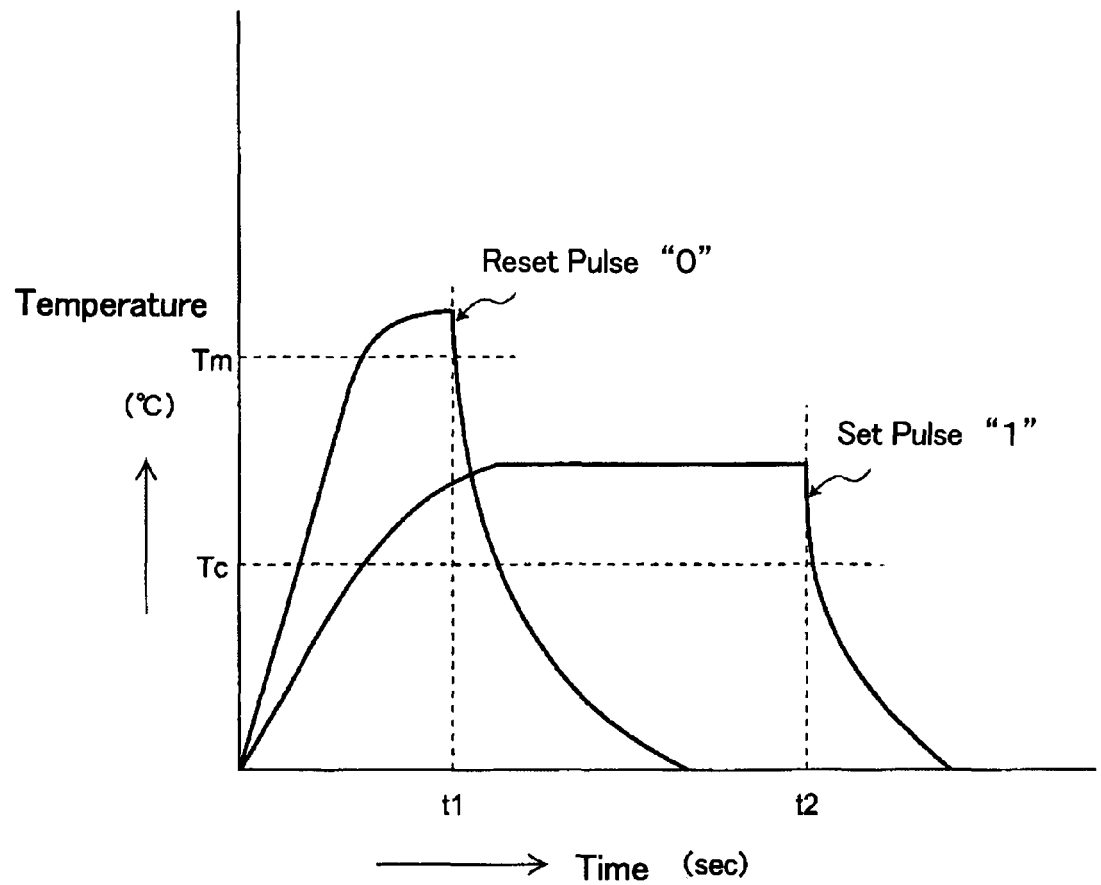
FIG. 2 is a schematic diagram showing an operation of a set and a reset of a phase-change element in the first embodiment of the present invention.

Embodiments of the present invention will be described below in detail with reference to the attached drawings. It should be noted that the present invention is not restricted to the embodiments but covers their equivalents. Throughout the attached drawings, similar or same reference numerals show similar, equivalent or same components.

First Embodiment

First, a semiconductor memory device and a method for fabricating the semiconductor memory device according to a first embodiment of the present invention will be described below in detail with reference to figures.

Figure 3:
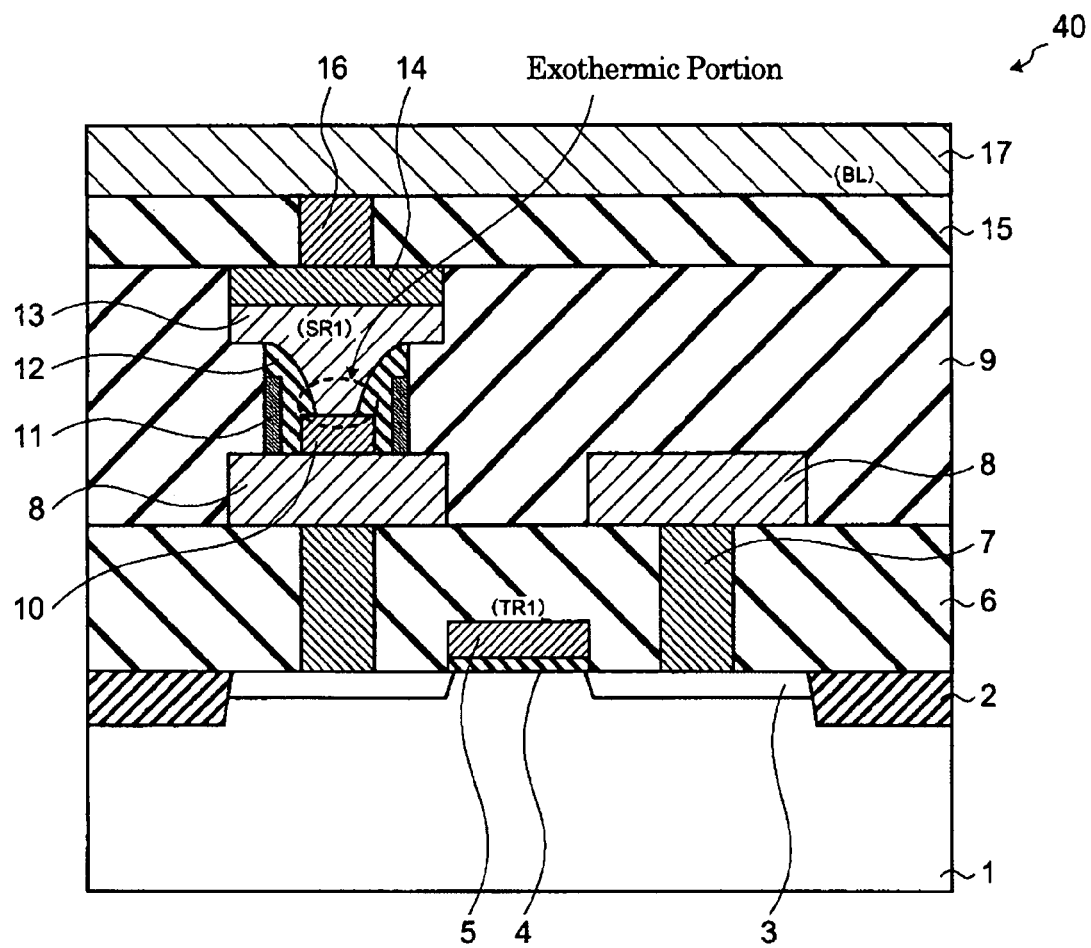
FIG. 3 is a cross-sectional view showing a memory cell portion of a phase-change memory in the first embodiment of the present invention.

FIG. 1 is a circuit diagram showing a PRAM memory cell. FIG. 2 is a schematic diagram showing an operation of a set and a reset of a phase-change element. FIG. 3 is a cross-sectional view showing a memory cell portion of a phase-change memory.

In this embodiment, a radiation-shield film suppresses and shields dissipation of thermal radiation emitted from joule heat portion where a phase-change film contacts with a lower electrode film.

As shown in FIG. 1, a PRAM (Phase Change Random Access Memory) memory cell 40 is composed of a phase-change element SR1, a transistor TR1 as a memory transistor. Further, the PRAM is called a phase-change memory. The transistor TR1 is composed of, for example, N-ch MISFET (Metal Insulator Semiconductor Field Effect Transistor). A gate of the transistor TR1 is connected with a word line WL and a source of the transistor TR1 is connected with a low potential power supply (earth potential) Vss. One end of the phase-change element SR1 is connected with the bit line BL and the other end of the phase-change element SR1 is connected with the drain of the transistor TR1. On the other hand, the source of the transistor TR1 may be connected with a plate line instead of a low potential power supply (earth potential) Vss, as a result, the PRAM memory cell may be used. Further, the phase-change element may be provided between the memory transistor and the plate line, and the drain of the memory cell transistor may be connected with the bit line so that the PRAM memory cell may be used. In this case, the source of the memory cell transistor is connected with the phase-change element.

As shown in FIG. 2, when the phase-change element SR1 is changed from a poly-crystalline state with lower resistance of "1" state to an amorphous state with higher resistance of "0", so called reset operation, a reset pulse signal of a period t1 with below 1 ns, for example, is applied to the phase-change element SR1. Flowing comparatively large current (reset current) to the phase-change element SR1 causes to rise up a temperature of the phase-change element SR1 over melting point (Tm), subsequently, the phase-change element SR1 is rapidly cooled.

On the other hand, when the phase-change element SR1 is changed from the amorphous state with higher resistance of "0" to the poly-crystalline state with lower resistance of "1", so called set operation, the reset pulse signal of a period t2 with above 10 ns, for example, is applied to the phase-change element SR1. Flowing comparatively small current (set current) to the phase-change element SR1 causes to lower down a temperature of the phase-change element SR1 below Tm, subsequently, the phase-change element SR1 is retained at over crystallization temperature (Tc) in a predetermined period.

As shown in FIG. 3, a STI (Shallow Trench Isolation) 2 isolating the memory transistor in the PRAM memory cell 40 is embedded at an upper potion of a semiconductor substrate 1. A surface of the STI2 is formed at the same level as a surface of the semiconductor substrate 1. A source/drain region 3 of the memory transistor with the conductive type being reverse to the semiconductor substrate 1 is selectively formed between the plurality of STI 2. A gate electrode film 5 being a gate electrode of the transistor TR1 is selectively formed over an upper portion of a region between the source/drain regions 3 in the semiconductor substrate 1 via a gate insulator 4. An interlayer dielectric film 6 is formed to cover the STI 2, the source/drain region 3, the gate insulator 4 and a gate electrode film 54.

An opening in the interlayer dielectric film 6 is formed on the source/drain region 3 so as to expose a portion of the source/drain region 3. A via-plug 7 is embedded in the opening. An interconnection layer 8 being connected with the via-plug 7 is formed on the via-plug 7. In addition, the interconnection layer 8 configured at the right side of transistor TR1 is connected with the low potential power supply Vss and the phase-change element SR1 is formed on the interconnection layer 8.

An interlayer dielectric film 9 is formed to cover the interconnection layer 8 expect the region of the interlayer dielectric film 6 and the phase-change element SR1. A lower electrode film 10 of the phase-change element SR1 is formed over the interconnection layer 8 and a phase-change film 13 is formed on the lower electrode film 10. An insulator 12 is formed on side-walls of the lower electrode film 10 and the side-walls in the lower portion of the phase-change film 13. A radiation-shield film 11 is formed via a joule heat portion and the insulator 12. An upper electrode film 14 is formed on the phase-change film 13.

An interlayer dielectric film 15 is formed on the interlayer dielectric film 9 and upper electrode film 14. An opening is formed in the interlayer dielectric film 15 to expose a portion of the upper electrode film 14. A via-plug 16 is embedded in the opening. An interconnection layer 17 being a bit line BL is formed on the interlayer dielectric film 15 and the via-plug 16 and is connected with the-via plug 16.

Here, when the reset pulse or the set pulse is applied to the phase-change element SR1, a portion where the phase-change film 13 contacts with the lower electrode film 10 becomes a joule heat portion. The radiation-shield film 11 suppresses and shields dissipation of thermal radiation emitted from joule heat portion. Therefore, a surface opposed to the joule heat portion of the radiation-shield film 11 is desirably a mirror finished surface to reflect the thermal radiation. The radiation-shield film 11 also is desirably a cylindrical shape to suppress and shield dissipation of thermal radiation emitted from the joule heat portion, or a cylindrical shape with the upper portion or the lower portion being formed as R state to shorten between the upper portion or the lower portion and the joule heat portion. Moreover, a square prism or a polygonal prism with central portion being empty may be used instead of the cylindrical shape.

Next, a method for fabricating phase-change memory will be described below in detail with reference to FIGS. 3-9. The processing steps on the phase-change memory are described as cross-sectional views in FIGS. 3-9.

Figure 4:
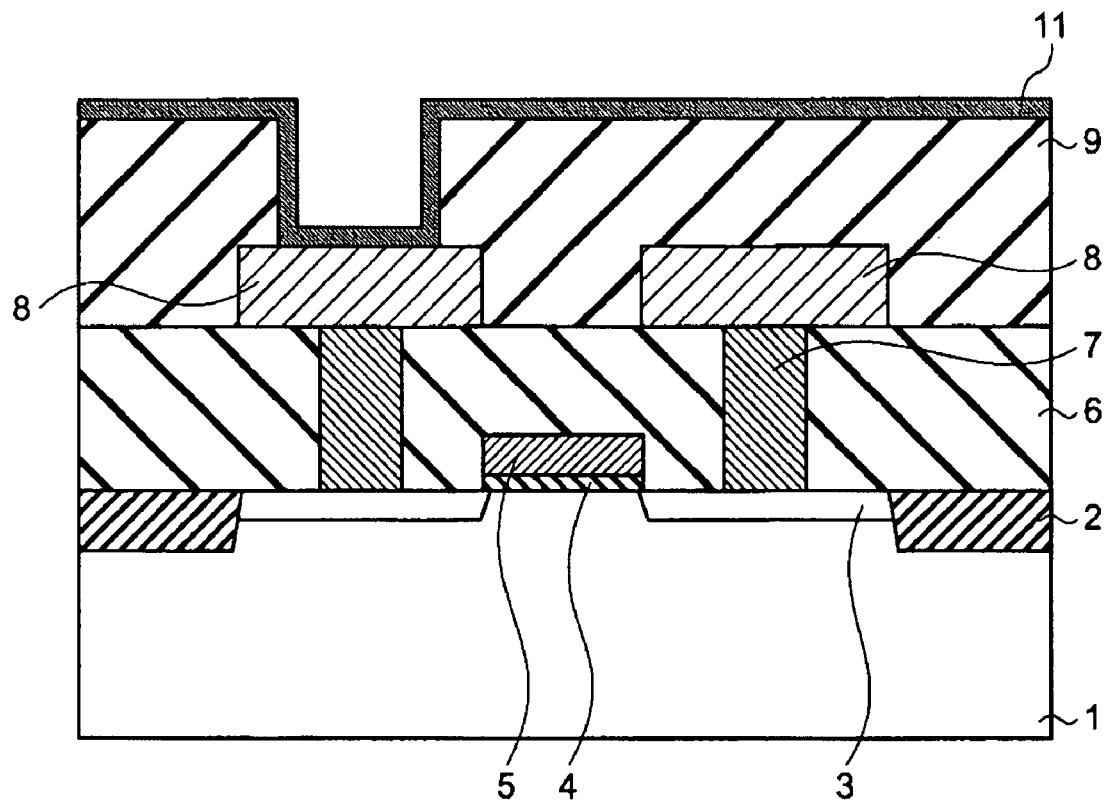
FIG. 4 is a cross-sectional view showing processing steps of the phase-change memory in the first embodiment of the present invention.

As shown in FIG. 4, the STI 2 is embedded at an upper portion of the semiconductor substrate 1. The gate insulator 4 and the gate electrode film 5 are selectively stacked on the semiconductor substrate 1 in layer. The source/drain region 3 is formed to sandwich a portion where the gate insulator 4 and the gate electrode film 5 are stacked in layer. The interlayer dielectric film 6 is formed on the STI 2, the source/drain region 3, the gate insulator 4 and the gate electrode film 5. The interlayer dielectric film 6 formed on the source/drain region is etched and the via-plug 7, for example W (tungsten), is embedded in the opening partially exposed on the source/drain region 3.

The interconnection layer 8 is formed on the via-plug 7, and the interlayer dielectric film 9 is formed on the interlayer dielectric film 6 and the interconnection layer 8. The interlayer dielectric film 9 on the interconnection layer 8 in a portion of the phase-change element SR1 is etched and the opening exposed a portion of the interconnection layer 8 is formed. The radiation-shield film 11 is formed on the opening and the interlayer dielectric film 9. Here, W is used as the radiation-shield film 11, however, AL (aluminum) or another metals being able to suppress and shield dissipation of thermal radiation may also be used. Further, a film except a metal film may be used as the radiation-shield film 11. For example, $Al_2O_3$, SiN, SiC, $ZrO_2$ or the like can be nominated as a material with suppressing thermal diffusion by lattice vibration.

Figure 5:
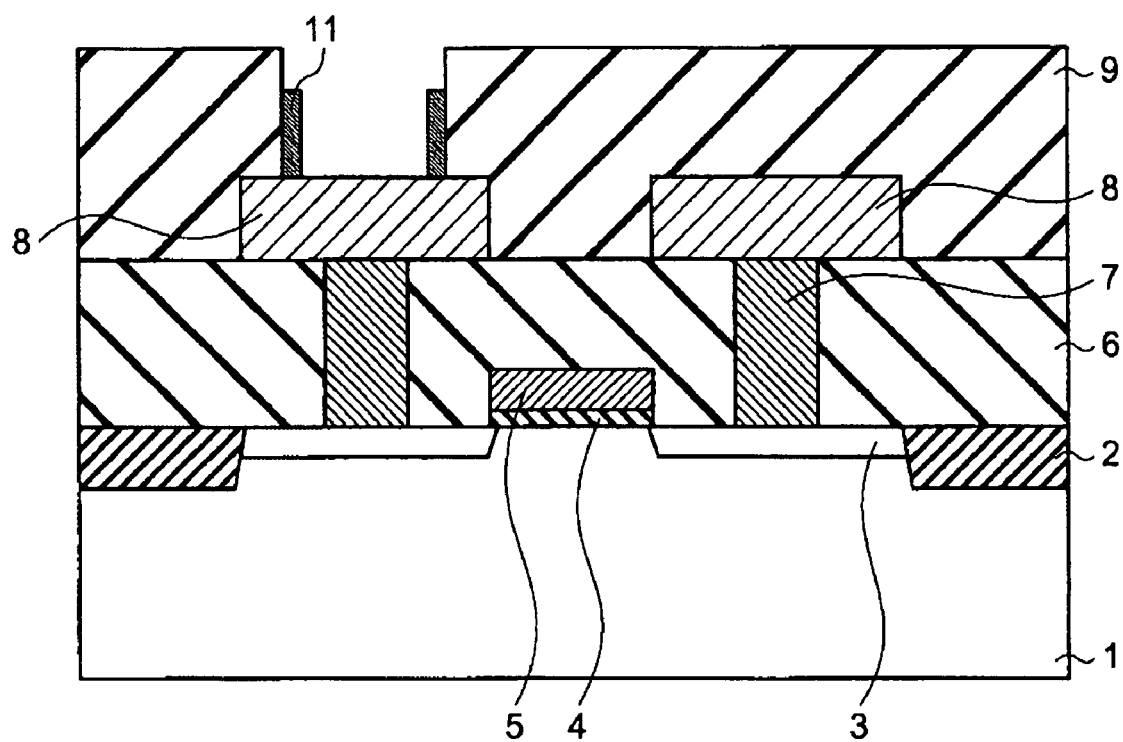
FIG. 5 is a cross-sectional view showing the processing steps of the phase-change memory in the first embodiment of the present invention.

As shown in FIG. 5, the radiation-shield film 11 is etched by RIE (Reactive Ion Etching), for example, so that the radiation-shield film 11 is remained on a side portion except the upper part of the opening. A higher etching rate (larger selective ratio) to the interlayer dielectric film 9 is favorably used on RIE process of the radiation-shield film 11.

Figure 6:
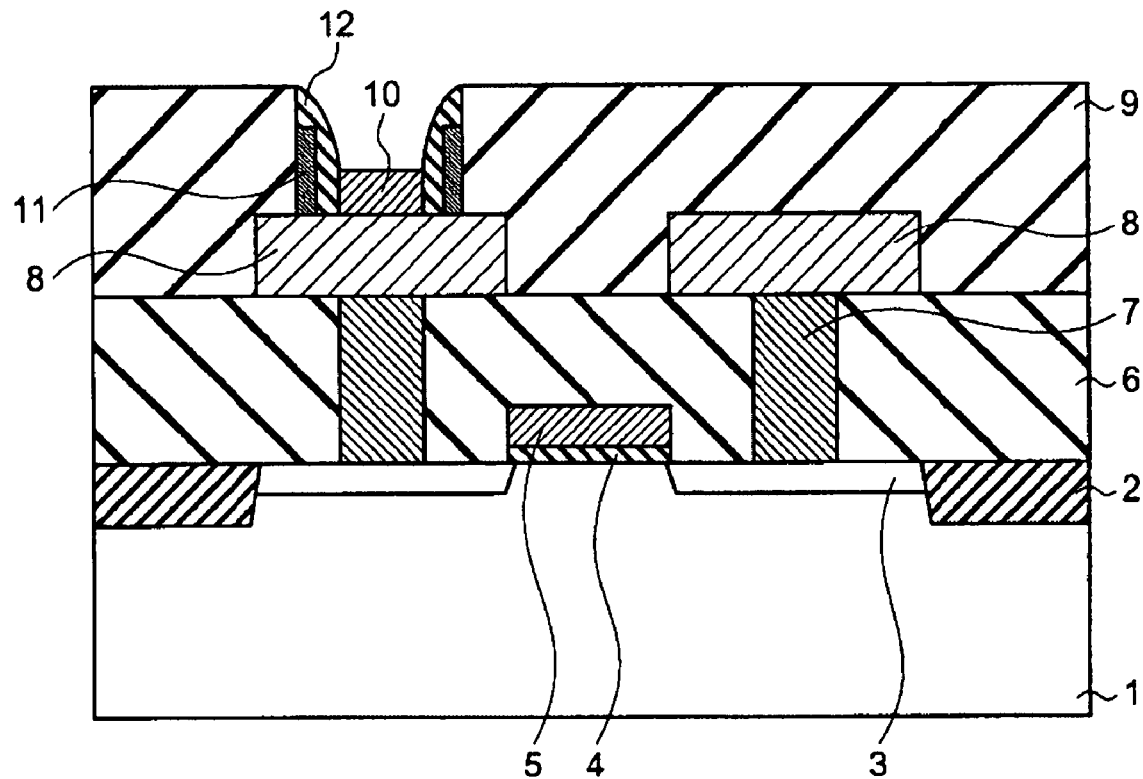
FIG. 6 is a cross-sectional view showing the processing steps of the phase-change memory in the first embodiment of the present invention.

As shown in FIG. 6, the insulator 12 is formed on the interconnection layer 8, the interlayer dielectric film 9 and the radiation-shield film 11 remained. The insulator 12 is etched by RIE, for example, and the insulator 12 is remained on the side-wall of the opening so that the radiation-shield film 11 is covered with the radiation-shield film 11. Consequently, the opening 8 on the interconnection layer is narrowed. The lower electrode film 10 is formed on the opening narrowed.

As shown in FIG. 7, the insulator 12 is again formed on the interlayer dielectric film 9, the lower electrode film 10 and the insulator 12 remained. The insulator 12 is etched by RIE, for example, so that the insulator 12 is remained on the upper end portion of the lower electrode film 10.

Figure 8:
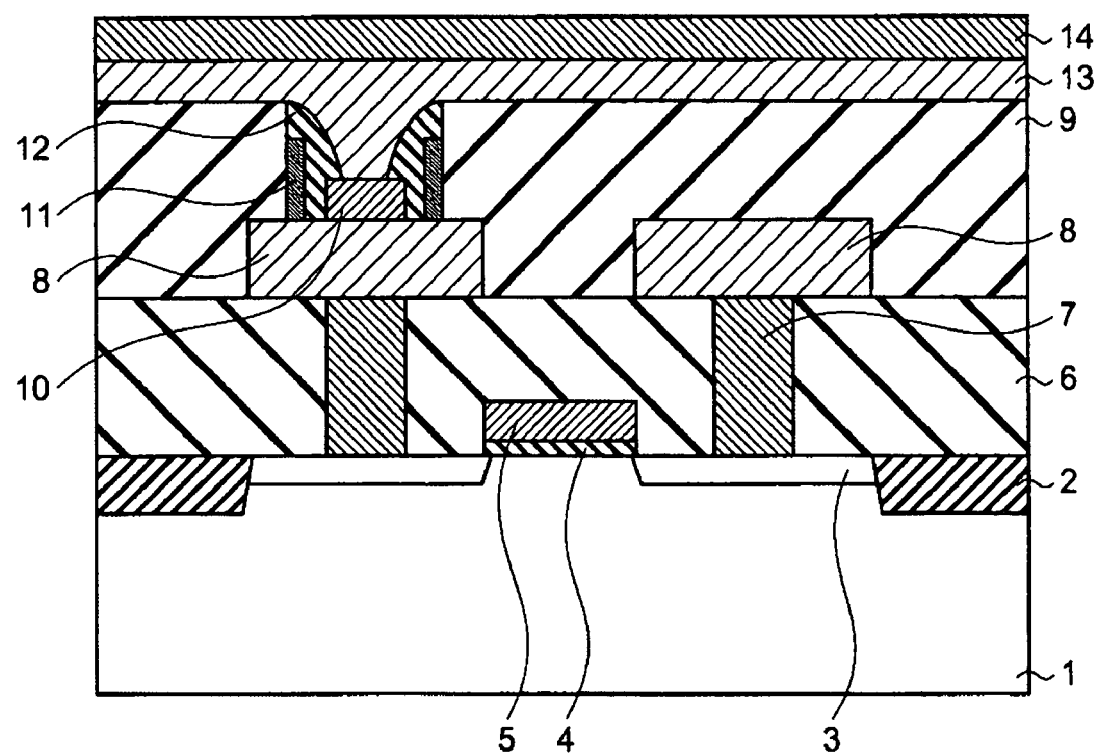
FIG. 8 is a cross-sectional view showing the processing steps of the phase-change memory in the first embodiment of the present invention.

As shown in FIG. 8, the phase-change film 13 and the upper electrode film 14 are stacked on the interlayer dielectric film 9, the lower electrode film 10 and the insulator 12 in layer. Here, TiN (titanium nitride) is used as the lower electrode film 10 and the upper electrode film 14, however, TiAlN (titanium-aluminum nitride), TiSiN (titanium-silicon nitride), TaAlN (tantalum-aluminum nitride), TaSiN (tantalum-silicon nitride) or the like also can be used. A SiON film is used as the insulator 12, however, a silicon oxide film (SiO2), a SiN film (silicon nitride film), SiOC or another low-k materials may also be used. A GST (GeSbTe-chalcogenate) is used as the phase-change film 13, however, AsSbTe, SeSbTe, doped-AsSbTe or doped-SeSbTe may be used. In this case, O (oxygen), N (nitrogen) or Si (silicon) may be used as a doping material.

As shown in FIG. 9, the phase-change film 13 and the upper electrode film 14 stacked in layer are etched by RIE, for example, the portion of the phase-change element SR1 in the phase-change film 13 and the upper electrode film 14 are remained the interlayer dielectric film 9 is again formed on the interlayer dielectric film, the phase-change film 13 and the upper electrode film 14, the interlayer dielectric film 9 is polished by CMP (Chemical Mechanical Polishing), for example, so that the upper electrode film 14 is exposed.

Furthermore, the interlayer dielectric film 15 is formed on the interlayer dielectric film 9 and the upper electrode film 14. An opening is formed in the interlayer dielectric film 15 to expose a portion of the upper electrode film 14, subsequently the via-plug 16 is embedded in the opening. The interconnection layer 17 is formed on the interlayer dielectric film 15 and the via-plug 16. the interconnection layer 17 becomes the bit line BL being connected with the via-plug 16. After forming the interconnection layer 17, the interlayer dielectric film and the interconnection layer are formed by using well-known technique so as to complete the PRAM.

As mentioned above, the phase-change element SR1 and the memory transistor are formed in the PRAM memory cell 40 in this embodiment of semiconductor memory device and the fabrication method. The phase-change element SR1 is composed of the lower electrode film 10, the phase-change film 13 and the upper electrode film 14. The lower electrode film 10 is connected with the drain of the memory transistor via the interconnection layer 8 and the via-plug 7. When the reset pulse or the set pulse is applied on the phase-change element SR1, the portion where the phase-change film 13 contacts with the lower electrode film 10 is heated up. When the reset pulse is applied, the reset current, relatively large current flows in the phase-change element SR1 so that the phase-change film 13 is melted to change to the amorphous state. On the other hand, when the set pulse is applied, relatively small current flows in the phase-change element SR1 so that the phase-change film 13 is crystallized to change to the poly-crystalline state. The radiation-shield film 11 is formed around the joule heat portion. The radiation-shield film 11 reflects thermal radiation emitted from the joule heat portion through the insulator 12 so as to suppress and shield dissipation of thermal radiation.

The phase-change element SR1 is exchanged from a poly-crystalline state with lower resistance of "1" state to an amorphous state with higher resistance of "0", therefore, the reset current, comparatively large current, can be decreased. Furthermore, the set current, comparatively small current, can be also decreased. The phase-change element SR1 is changed from the amorphous state with higher resistance of "0" to the poly-crystalline state with lower resistance of "1" state. Accordingly, the phase-change memory can be highly integrated and information in the phase-change memory can precisely be written in and read out at low voltage. Moreover, decrease with consumption current on writing and reading can easily cause to an on-chip device of CMOS circuit or the like.

Furthermore, the insulator 12 is formed between the lower electrode film 10 and the radiation-shield film 11 by using two-step RIE technique in this embodiment, however, the insulator 12 may be remained and formed by conventional one-step RIE technique.

Second Embodiment

Next, a semiconductor memory device and a method for fabricating the semiconductor memory device according to a second embodiment of the present invention will be described below in detail with reference to figures.

Figure 10:
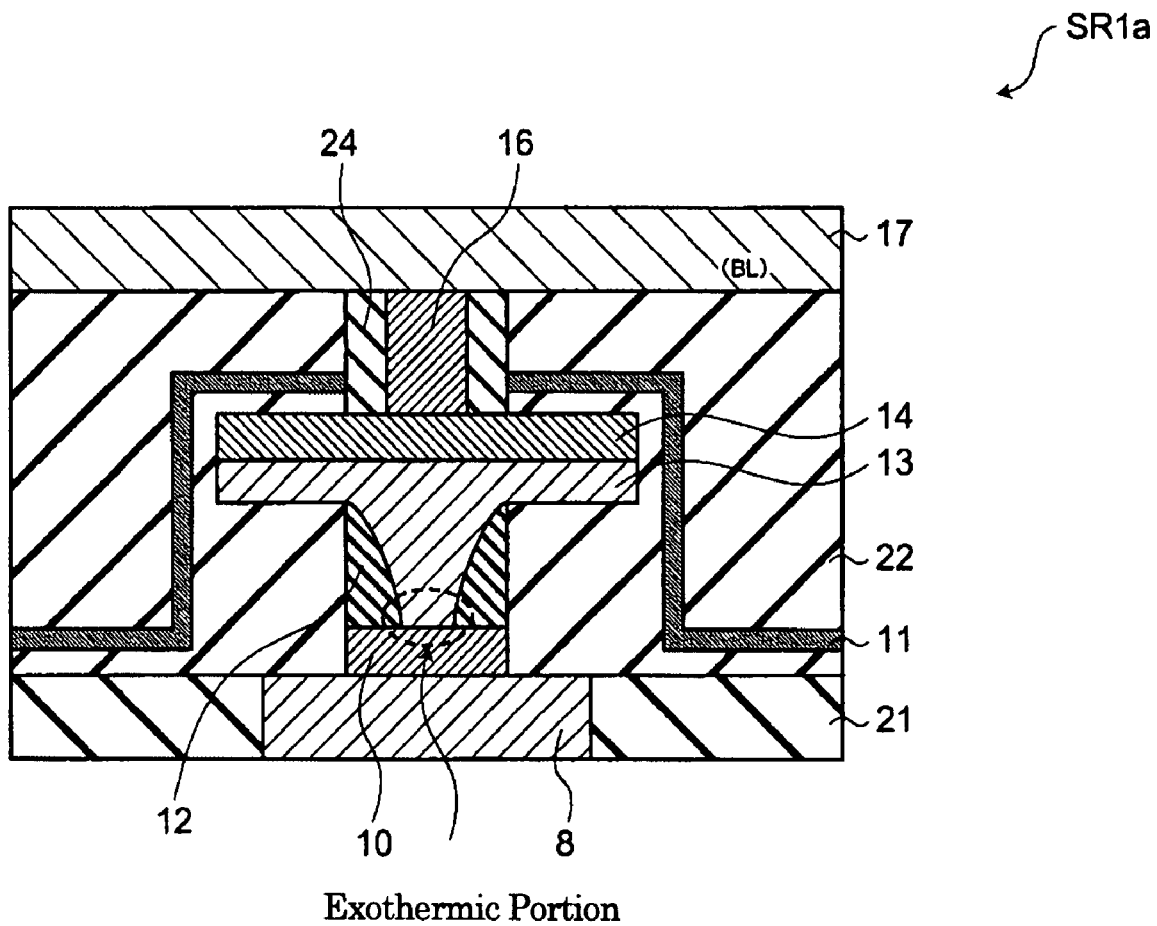
FIG. 10 is a cross-sectional view showing a phase-change element of a phase-change memory in a second embodiment of the present invention.

FIG. 10 is a cross-sectional view showing a phase-change element of a phase-change. A setting position of a radiation-shield film is changed as comparing with the position of the first embodiment. The radiation-shield film suppresses and shields dissipation of thermal radiation emitted from a joule heat portion where a phase-change film contacts with a lower electrode film.

The second embodiment will be described below in detail with reference to the attached drawings. Throughout the attached drawings, similar or same reference numerals show similar, equivalent or same components.

As shown in FIG. 10, in a PRAM memory cell, a phase-change element SR1a is formed on the interconnection layer 8. In the PRAM cell of this embodiment, as a portion under the interconnection layer is the same structure as the first embodiment, the description of the same or similar parts and elements will be omitted The lower electrode film 10 of the phase-change element SR1a is formed on the interconnection layer 8 having a side-wall covered with a interlayer dielectric film 21. The upper electrode film 14 of the phase-change film 13 and the phase-change element SR1a are stacked on the lower electrode film 10 in layer. The insulator 12 is formed on both side-walls of the lower electrode film 10 and both side-walls of the under part of the phase-change film 13. the via-plug 16 is formed on the center portion of the upper electrode film 14, an insulator 24 is formed on the both ends of the via-plug 16. The radiation-shield film 11 is embedded in a interlayer dielectric film 22. The both ends of the radiation-shield film 11 are formed on the interlayer dielectric film 21, the both side-walls of the radiation-shield film 11 is formed to oppose to the phase-change element SR1a via the interlayer dielectric film 22. The upper portion of the radiation-shield film 11 is formed to oppose to the upper electrode film 14 via the interlayer dielectric film 22, as a result, the radiation-shield film 11 is formed apart from the via-plug 16 via the insulator 24. The interconnection layer 17 is formed on the interlayer dielectric film 22 and the via-plug 16 to become the bit line BL being connected with the via-plug 16.

Here, when the reset pulse or the set pulse is applied to the phase-change element SR1a, a portion where the phase-change film 13 contacts with the lower electrode film 10 becomes a joule heat portion. The radiation-shield film 11 suppresses and shields dissipation of thermal radiation emitted from joule heat portion. Therefore, a surface opposed to the joule heat portion, especially the side portion, of the radiation-shield film 11 is desirably a mirror finished surface to reflect the thermal radiation. The side-wall of the radiation-shield film 11 also is desirably a cylindrical shape to suppress and shield dissipation of thermal radiation emitted from the joule heat portion. Moreover, a square prism or a polygonal prism with central portion being empty may be used as the side-wall instead of the cylindrical shape.

Next, processing steps on the phase-change memory are described as cross-sectional views in FIGS. 11-14. Here, processing steps of forming a transistor of the PRAM memory cell and the via-plug 7 are omitted, because the processing steps are the same as the first embodiment.

As shown in FIG. 11, interconnection layer 8 is formed on the via-plug 7 and the interlayer dielectric film 21 is formed on the side-wall of the interconnection layer 8. The interlayer dielectric film 22 is formed on the interconnection layer 8 and the interlayer dielectric film 21. The interlayer dielectric film 22 on the interconnection layer 8 is etched to form the opening with exposing the interconnection layer 8. The lower electrode film 10 of the phase-change element SR1a is embedded in the bottom of the opening. the insulator 12 is formed on the lower electrode film 10 and the interlayer dielectric film 22. The insulator 12 is etched by RIE, for example, to remain the insulator 12 on the side-wall portion of the opening. The phase-change film 13 and the upper electrode film 14 of the phase-change element SR1a are stacked on the lower electrode film 10, the insulator 12 and the interlayer dielectric film 22 in layer.

As shown in FIG. 12, the upper electrode film 14, the phase-change film 13 and the interlayer dielectric film 22 are etched by RIE, for example, to form the upper electrode film 14 in the phase-change element SR1 and the phase-change film 13.

Figure 13:
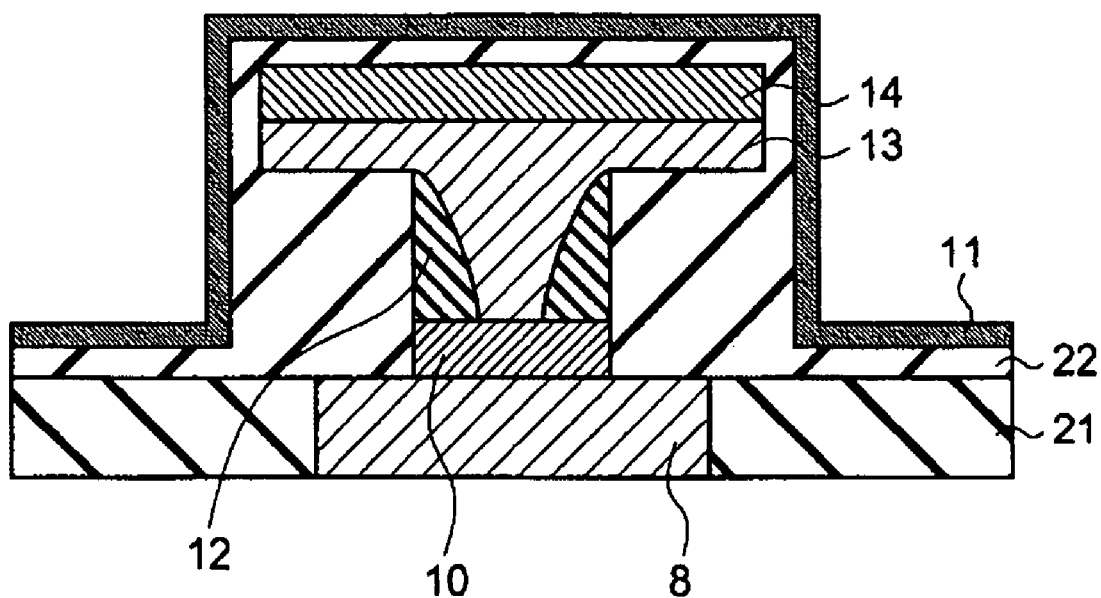
FIG. 13 is a cross-sectional view showing processing steps of the phase-change memory in the second embodiment of the present invention.

As shown in FIG. 13, the interlayer dielectric film 22 is formed on the upper electrode film 14, the phase-change film 13 and the interlayer dielectric film 21. Subsequently, the radiation-shield film 11 is formed on the interlayer dielectric film. The interlayer dielectric film 22 is electrically isolated between the upper electrode film 14 and the radiation-shield film 11, and between the phase-change film 13 and the radiation-shield film 11.

Figure 14:
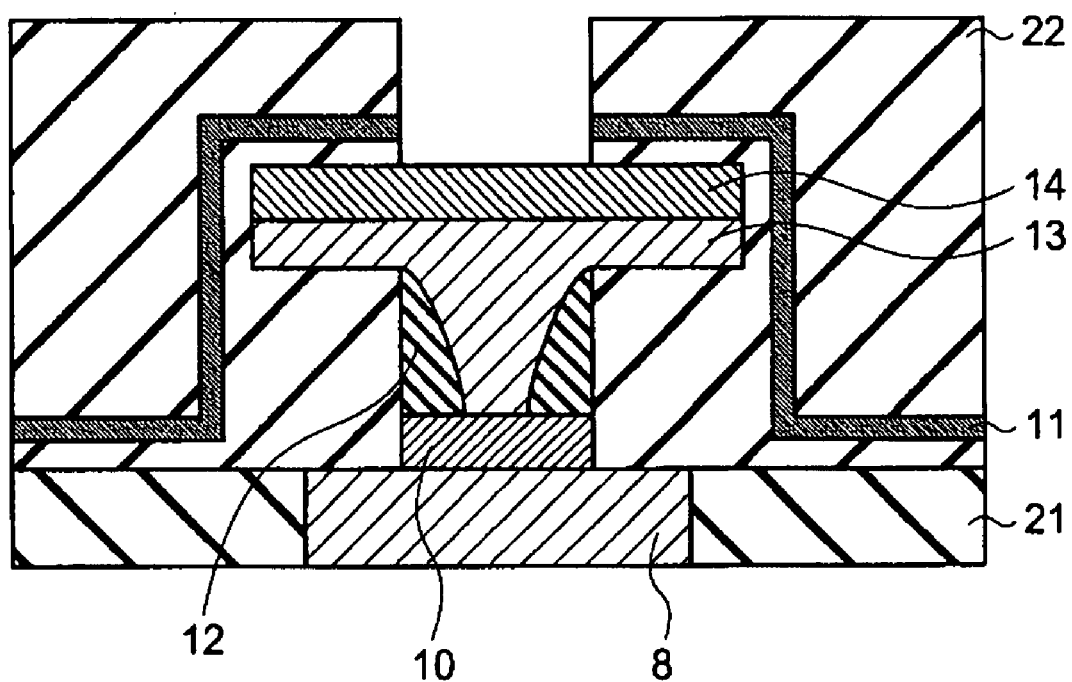
FIG. 14 is a cross-sectional view showing processing steps of the phase-change memory in the second embodiment of the present invention.

As shown in FIG. 14, the interlayer dielectric film 22 is formed on the radiation-shield film 11. The interlayer dielectric film 22 and the radiation-shield film 11 on the upper electrode film 14 are etched to form the opening with exposing the upper electrode film 14.

Furthermore, the insulator 24 is formed on the interlayer dielectric film 22 and the opening. The insulator 24 is etched by RIE, for example, to remain the insulator 24 on the side-wall of the opening. The via-plug 16 is embedded in the opening being formed on the side-wall. The interconnection layer 17 is formed on the via-plug 16 and the interlayer dielectric film 22 to be formed as the bit line BL being connected with the via-plug 16. After forming the interconnection layer 17, the interlayer dielectric film and the interconnection layer are formed by using well-known technique so as to complete the PRAM.

As mentioned above, the phase-change element SR1a and the memory transistor are formed in the PRAM memory cell in this embodiment of semiconductor memory device and the fabrication method. The phase-change element SR1a is composed of the lower electrode film 10, the phase-change film 13 and the upper electrode film 14. When the reset pulse or the set pulse is applied on the phase-change element SR1a, the portion where the phase-change film 13 contacts with the lower electrode film 10 is heated up. When the reset pulse is applied, the reset current, relatively large current flows in the phase-change element SR1a so that the phase-change film 13 is melted to change to the amorphous state. On the other hand, when the set pulse is applied, relatively small current flows in the phase-change element SR1a so that the phase-change film 13 is melted to change to the poly-crystalline state. The radiation-shield film 11 is formed over the both sides and the upper side of the joule heat portion through the insulator 12 and the interlayer dielectric film 22. The radiation-shield film 11 reflects thermal radiation emitted from the joule heat portion through the insulator 12 and the interlayer dielectric film 22 so as to suppress and shield dissipation of thermal radiation.

Therefore, the reset current, comparatively large current, can be decreased. The phase-change element SR1a is changed from a poly-crystalline state with lower resistance of "1" state to an amorphous state with higher resistance of "0". Furthermore, the set current, comparatively small current, can be also decreased. The phase-change element SR1a is exchanged from the amorphous state with higher resistance of "0" to the poly-crystalline state with lower resistance of "1" state. Accordingly, the phase-change memory can be highly integrated and information in the phase-change memory can precisely be written in and read out at low voltage.

Furthermore, the height of the both end portions in the radiation-shield film 11 is set about the same height of the electrode film 10 in this embodiment, however, may be formed in the interlayer dielectric film 21 so as to be formed at a side being lower than the lower electrode film 10, namely, being a side of the semiconductor substrate 1 under the lower electrode film 10.

Third Embodiment

Next, a semiconductor memory device according to a third embodiment of the present invention will be described below in detail with reference to figures.

Figure 15:
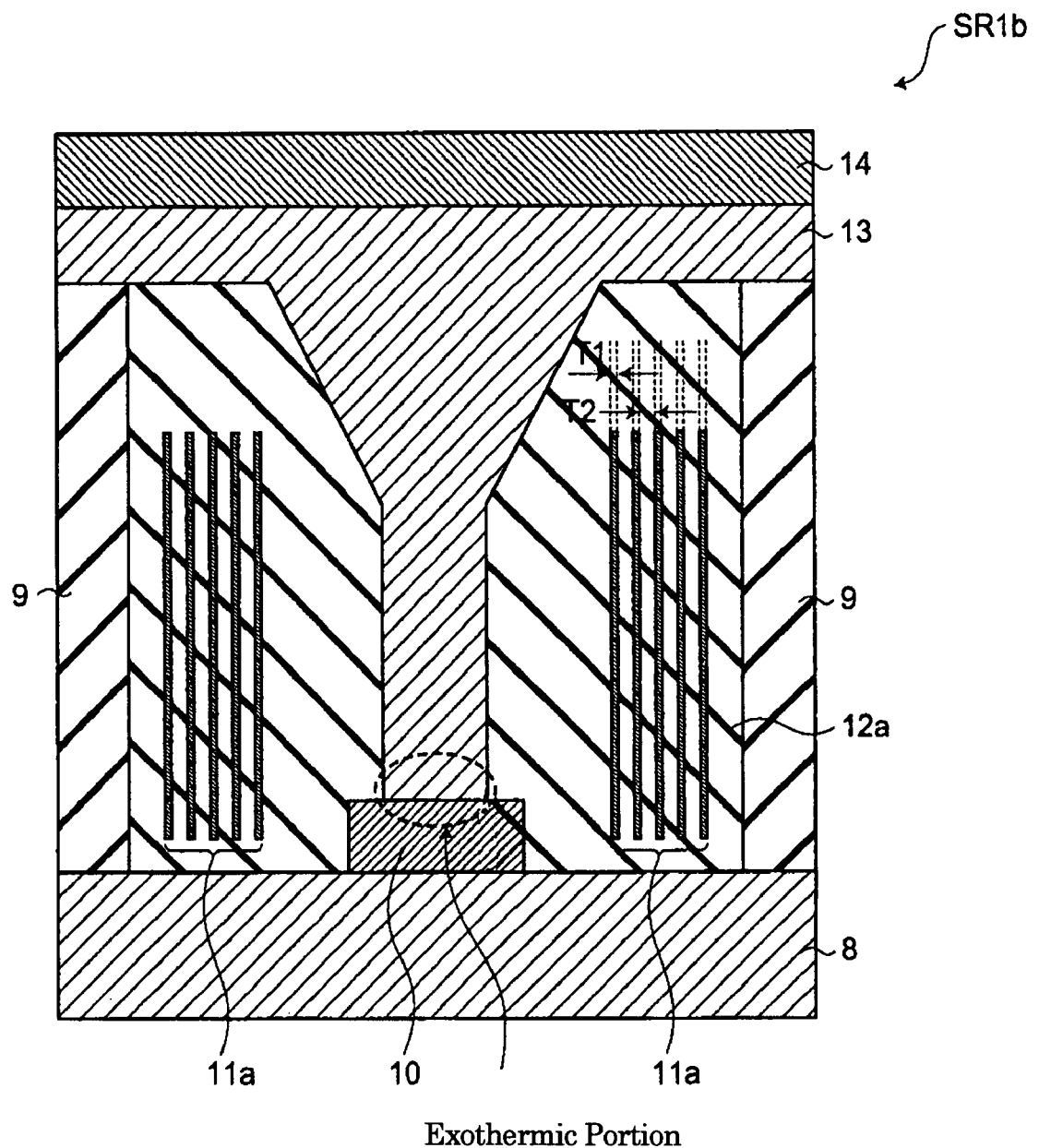
FIG. 15 is a cross-sectional view showing a phase-change element of a phase-change memory in a third embodiment of the present invention.

FIG. 15 is a cross-sectional view showing a phase-change element of a phase-change. A structure of a radiation-shield film is changed as comparing with the structure of the first embodiment. The radiation-shield film suppresses and shields dissipation of thermal radiation emitted from a joule heat portion where a phase-change film contacts with a lower electrode film.

The third embodiment will be described below in detail with reference to the attached drawings. Throughout the attached drawings, similar or same reference numerals show similar, equivalent or same components.

As shown in FIG. 15, in a PRAM memory cell, a phase-change element SR1b is formed on the interconnection layer 8. In the PRAM cell of this embodiment, as a portion under the interconnection layer is the same structure as the first embodiment, the description of the same or similar parts and elements will be omitted.

First, the lower electrode film 10 of the phase-change element SR1b is formed on the interconnection layer 8. The upper electrode film 14 of the phase-change film 13 and the phase-change element SR1b are stacked on the lower electrode film 10 in layer.

A pair of radiation-shield film 11a and an insulator 12a is periodically formed in lateral direction through the joule heat portion and the insulator 12a. The interlayer dielectric film 9 is formed on the side-wall of the insulator 12 on the interconnection layer 8.

Here, the radiation-shield film 11a is periodically formed five layers, a film thickness T1 of the radiation-shield film 11a, for example, is formed as 1 nm and a interval T2 between the radiation-shield films 11a, for example, is formed as 1 nm. Therefore, the plurality of the radiation-shield film 11a can effectively reflect thermal radiation so as to suppress and shield dissipation of the thermal radiation. As the radiation-shield film 11a is formed apart in the range of 10 nm from the joule heat portion where the phase-change film 13 contact with the lower electrode film 10, the radiation-shield film 11a is retained at a comparatively lower temperature. Accordingly, a metal with comparatively lower melting point can be used as the radiation-shield film 11a. Furthermore, the radiation-shield film 11a may be a film expect metal which suppress thermal diffusion by lattice vibration. As a material, for example, $Al_2O_3$, SiN, SiC, $ZrO_2$ or the like is nominated. The pair of the radiation-shield film 11a and the insulator 12a formed periodically in lateral direction may surround the joule heat portion as a cylindrical shape. Further, a square prism and a polygonal prism also may be in stead of the cylindrical shape.

As mentioned above, the phase-change element SR1b and the memory transistor are formed in the PRAM memory cell in this embodiment of semiconductor memory device and the fabrication method. The phase-change element SR1b is composed of the lower electrode film 10, the phase-change film 13 and the upper electrode film 14. When the reset pulse or the set pulse is applied on the phase-change element SR1b, the portion where the phase-change film 13 contacts with the lower electrode film 10 is heated up. When the reset pulse is applied, the reset current, relatively large current flows in the phase-change element SR1b so that the phase-change film 13 is melted to change to the amorphous state. On the other hand, when the set pulse is applied, relatively small current flows in the phase-change element SR1b so that the phase-change film 13 is melted to change to the poly-crystalline state. The radiation-shield film 11a is formed around the joule heat portion via the insulator 12a, the insulator 12a formed periodically reflects thermal radiation emitted from so as to suppress and shield dissipation of thermal radiation.

Therefore, the reset current, comparatively large current, can be decreased. The phase-change element SR1b is exchanged from a poly-crystalline state with lower resistance of "1" state to an amorphous state with higher resistance of "0". Furthermore, the set current, comparatively small current, can be also decreased. The phase-change element SR1b is exchanged from the amorphous state with higher resistance of "0" to the poly-crystalline state with lower resistance of "1" state. Accordingly, the phase-change memory can be highly integrated and information in the phase-change memory can precisely be written in and read out at low voltage.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the radiation-shield film is applied to the PRAM memory cell in this embodiment, however, the radiation-shield film can also be a chain-type PRAM.

What is claimed is:

1. A semiconductor memory device, comprising:
   a semiconductor substrate;
   a phase-change element formed on the semiconductor substrate, the phase-change element including a phase-change film and electrode films;
   a joule heat portion contacting with the electrode film, the phase-change film being formed around the joule heat portion; and
   a radiation-shield film suppressing dissipation of thermal radiation emitted from the joule heat portion.

2. The semiconductor memory device according to claim 1, wherein
   the phase-change element includes a upper electrode film and a lower electrode film as the electrode films, the upper electrode film, the phase-change film and the lower electrode film are stacked in layer, and the joule heat portion contacts with the lower electrode film and the radiation-shield film is formed around the lower electrode film.

3. The semiconductor memory device according to claim 1, wherein
the radiation-shield film is composed of a metal film, is formed at a side plane of the joule heat portion via a insulator and has a cylindrical shape or polygonal prism shape.

4. The semiconductor memory device according to claim 1, wherein
the radiation-shield film is composed of a metal film and is formed at the side plane and an upper plane of the joule heat portion via the insulator.

5. The semiconductor memory device according to claim 1, wherein
A plurality of the radiation-shield films are composed of a metal film and are formed at the side plane of the joule heat portion via the insulator.

6. The semiconductor memory device according to claim 5, wherein
each of the radiation-shield films is formed at equal interval.

7. The semiconductor memory device according to claim 1, wherein
the radiation-shield film is composed of tungsten or aluminum.

8. The semiconductor memory device according to claim 1, wherein
the radiation-shield film is at least one of $Al_2O_3$, SiN, SiC and $ZrO_2$.

9. The semiconductor memory device according to claim 1, wherein
the phase-change film is GeSbTe, AsSbTe, SeSbTe, doped-GeSbTe, doped-AsSbTe or doped-SeSbTe and the doping materials being oxygen, nitrogen or silicon.

10. The semiconductor memory device according to claim 2, further comprising:
memory transistor including a gate electrode film, a gate insulator, a source and a drain;
the gate electrode film being formed on the semiconductor substrate via the gate insulator;
the source and the drain sandwiching a portion being below the gate electrode film in the semiconductor substrate, the drain connecting with the lower electrode film.

11. The semiconductor memory device according to claim 10, further comprising:
a via-plug being formed on at least one of the drain or the source of the memory transistor;
the phase-change element being formed above the via-plug, the lower electrode film connecting with the drain via the via-plug.

12. The semiconductor memory device according to claim 10, further comprising:
an interconnection portion formed between the lower electrode film and the via-plug.

13. The semiconductor memory device according to claim 10, wherein
the radiation-shield film is formed around the lower electrode film, the radiation-shield film is composed of a metal film, the radiation-shield film is formed at side-wall of the joule heat portion via a insulator and has a cylindrical shape or a polygonal prism shape.

14. The semiconductor memory device according to claim 10, wherein
the radiation-shield film is formed around the lower electrode film, the radiation-shield film is composed of a metal and the radiation-shield film is formed on the side-wall and the upper portion of the joule heat portion via insulator.

15. The semiconductor memory device according to claim 10, wherein
a plurality of the radiation-shield film are formed around the lower electrode film, the plurality of the radiation-shield film are composed of a metal and the plurality of the radiation-shield film are formed on side-wall and the upper portion of the joule heat portion via insulator.

16. The semiconductor memory device according to claim 1, further comprising:
a plurality of the phase-change element being chain structure.

* * * * *

UNITED STATES PATENT AND TRADEMARK OFFICE
CERTIFICATE OF CORRECTION

PATENT NO. : 7,808,816 B2
APPLICATION NO. : 11/905079
DATED : October 5, 2010
INVENTOR(S) : Tanaka et al.

It is certified that error appears in the above-identified patent and that said Letters Patent is hereby corrected as shown below:

Claim 2, column 10, line 64, change "a upper" to --an upper--.

Claim 2, column 10, line 67, change "stacked in layer," to --stacked in layers,--.

Claim 3, column 11, lines 7-8, change "a insulator" to --an insulator--.

Claim 5, column 11, line 17, change "A plurality" to --a plurality--.

Claim 6, column 11, lines 22-23, change "formed at equal interval." to --formed at equal intervals.--.

Claim 13, column 12, lines 19-20, change "at side-wall" to --at a side-wall--.

Claim 13, column 12, line 20, change "a insulator" to --an insulator--.

Claim 14, column 12, line 28, change "via insulator." to --via the insulator.--.

Claim 15, column 12, line 31, change "a plurality of the radiation-shield film" to --a plurality of the radiation-shield films--.

Claim 15, column 12, lines 32-33, change "the plurality of the radiation-shield film" to --the plurality of the radiation-shield films--.

Claim 15, column 12, lines 33-34, change "the plurality of the radiation-shield film" to --the plurality of the radiation-shield films--.

Claim 15, column 12, line 34, change "on side-wall" to --on the side-wall--.

Claim 15, column 12, line 35, change "via insulator." to --via the insulator.--.

Signed and Sealed this
Fourteenth Day of June, 2011

David J. Kappos
*Director of the United States Patent and Trademark Office*

Claim 15, column 12, lines 38-39, change "a plurality of the phase-change element being chain structure." to --a plurality of the phase-change elements being chain structures.--.